US008600540B2

(12) United States Patent
Jones et al.

(10) Patent No.: US 8,600,540 B2
(45) Date of Patent: *Dec. 3, 2013

(54) METHODS FOR NON-LOT-BASED MANUFACTURING OF ARTICLES

(75) Inventors: Mark L. Jones, Boise, ID (US); Gregory A. Barnett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/615,018

(22) Filed: Sep. 13, 2012

(65) Prior Publication Data

US 2013/0006411 A1 Jan. 3, 2013

Related U.S. Application Data

(63) Continuation of application No. 12/776,625, filed on May 10, 2010, now Pat. No. 8,315,730, which is a continuation of application No. 11/763,104, filed on Jun. 14, 2007, now Pat. No. 7,738,988, which is a continuation of application No. 10/205,918, filed on Jul. 25, 2002, now Pat. No. 7,555,358, which is a continuation of application No. 09/137,781, filed on Aug. 20, 1998, now Pat. No. 6,427,092, which is a continuation of application No. 08/822,731, filed on Mar. 24, 1997, now Pat. No. 5,856,923.

(51) Int. Cl.
*G06F 19/00* (2011.01)

(52) U.S. Cl.
USPC .............................. 700/121; 700/115; 700/116

(58) Field of Classification Search
USPC ........... 700/95, 108, 109, 110, 112, 115, 116, 700/117, 121, 215; 702/182, 183, 184, 185, 702/187; 438/14, 18; 365/103; 209/573, 209/583

See application file for complete search history.

(56) References Cited

U.S. PATENT DOCUMENTS

| 4,027,246 A | 5/1977 | Caccoma et al. |
| 4,032,949 A | 6/1977 | Bierig |

(Continued)

FOREIGN PATENT DOCUMENTS

| EP | 0849675 A2 | 6/1998 |
| JP | 58050728 A | 3/1983 |

(Continued)

OTHER PUBLICATIONS

Fresonke, Dean, In-Fab Identification of Silicon Wafers with Clean, Laser Marked Barcodes, Advanced Semiconductor Manufacturing Conference and Workshop, 1994, IEEE/SEMI, pp. 157-160.

(Continued)

*Primary Examiner* — Charles Kasenge
(74) *Attorney, Agent, or Firm* — TraskBritt

(57) ABSTRACT

A method for continuous, non lot-based manufacturing of integrated circuit (IC) devices of the type to each have a unique fuse identification (ID) includes: reading the fuse ID of each of the IC devices; advancing multiple lots of the IC devices through, for example, a test step in the manufacturing process in a substantially continuous manner; generating data, such as test data, related to the advancement of each of the IC devices through the step in the process; and associating the data generated for each of the IC devices with the fuse ID of its associated IC device.

19 Claims, 2 Drawing Sheets

(56) References Cited

U.S. PATENT DOCUMENTS

| | | | |
|---|---|---|---|
| 4,150,331 A | 4/1979 | Lacher et al. | |
| 4,454,413 A | 6/1984 | Morton | |
| 4,455,495 A | 6/1984 | Masuhara et al. | |
| 4,460,999 A | 7/1984 | Schmidt | |
| 4,510,673 A * | 4/1985 | Shils et al. | 438/15 |
| 4,534,014 A | 8/1985 | Ames | |
| 4,667,403 A | 5/1987 | Edinger et al. | |
| 4,736,373 A | 4/1988 | Schmidt | |
| 4,796,194 A * | 1/1989 | Atherton | 700/103 |
| 4,871,963 A | 10/1989 | Cozzi et al. | |
| 4,954,453 A | 9/1990 | Venutolo et al. | |
| 4,958,373 A | 9/1990 | Usami et al. | |
| 4,967,381 A | 10/1990 | Lane et al. | |
| 4,985,988 A | 1/1991 | Littlebury et al. | |
| 5,003,251 A | 3/1991 | Fuoco | |
| 5,014,208 A * | 5/1991 | Wolfson | 700/99 |
| 5,043,657 A | 8/1991 | Amazeen et al. | |
| 5,103,166 A | 4/1992 | Jeon et al. | |
| 5,105,362 A | 4/1992 | Kotani et al. | |
| 5,110,754 A | 5/1992 | Lowrey et al. | |
| 5,118,369 A | 6/1992 | Shamir et al. | |
| 5,150,331 A | 9/1992 | Harris | |
| 5,175,774 A | 12/1992 | Truax et al. | |
| 5,197,650 A | 3/1993 | Monzen et al. | |
| 5,217,834 A | 6/1993 | Higaki et al. | |
| 5,219,765 A | 6/1993 | Yoshida et al. | |
| 5,226,118 A | 7/1993 | Baker et al. | |
| 5,235,550 A | 8/1993 | Zagar et al. | |
| 5,253,208 A | 10/1993 | Kang | |
| 5,256,562 A | 10/1993 | Vu et al. | |
| 5,256,578 A | 10/1993 | Corley et al. | |
| 5,271,796 A | 12/1993 | Miyashita et al. | |
| 5,289,113 A | 2/1994 | Meaney et al. | |
| 5,294,812 A * | 3/1994 | Hashimoto et al. | 257/65 |
| 5,296,402 A | 3/1994 | Ryou | |
| 5,301,143 A * | 4/1994 | Ohri et al. | 365/96 |
| 5,326,709 A | 7/1994 | Moon et al. | |
| 5,345,110 A | 9/1994 | Renfro et al. | |
| 5,347,463 A | 9/1994 | Nakamura et al. | |
| 5,350,715 A | 9/1994 | Lee et al. | |
| 5,352,945 A | 10/1994 | Casper | |
| 5,355,320 A | 10/1994 | Erjavic et al. | |
| 5,360,747 A | 11/1994 | Larson et al. | |
| 5,375,062 A * | 12/1994 | Aoki | 700/99 |
| 5,399,531 A | 3/1995 | Wu | |
| 5,420,796 A | 5/1995 | Weling et al. | |
| 5,424,652 A | 6/1995 | Hembree et al. | |
| 5,428,311 A | 6/1995 | McClure | |
| 5,440,493 A | 8/1995 | Doida | |
| 5,442,561 A | 8/1995 | Yoshizawa et al. | |
| 5,448,488 A | 9/1995 | Oshima | |
| 5,450,326 A | 9/1995 | Black | |
| 5,467,304 A | 11/1995 | Uchida et al. | |
| 5,477,493 A | 12/1995 | Danbayashi | |
| 5,483,175 A | 1/1996 | Ahmad et al. | |
| 5,495,417 A | 2/1996 | Fuduka et al. | |
| 5,504,369 A | 4/1996 | Dasse et al. | |
| 5,511,005 A | 4/1996 | Abbe et al. | |
| 5,516,028 A | 5/1996 | Rasp et al. | |
| 5,537,325 A * | 7/1996 | Iwakiri et al. | 700/121 |
| 5,538,141 A | 7/1996 | Gross, Jr. et al. | |
| 5,539,235 A | 7/1996 | Allee | |
| 5,550,838 A | 8/1996 | Okajima | |
| 5,563,832 A | 10/1996 | Kagami | |
| 5,567,927 A * | 10/1996 | Kahn et al. | 235/462.01 |
| 5,568,408 A | 10/1996 | Maeda | |
| 5,570,293 A | 10/1996 | Tanaka et al. | |
| 5,581,510 A | 12/1996 | Furusho et al. | |
| 5,590,069 A | 12/1996 | Levin | |
| 5,600,171 A | 2/1997 | Makihara et al. | |
| 5,603,412 A | 2/1997 | Gross, Jr. et al. | |
| 5,606,193 A | 2/1997 | Ueda et al. | |
| 5,617,366 A | 4/1997 | Yoo | |
| 5,619,469 A | 4/1997 | Joo et al. | |
| 5,625,816 A | 4/1997 | Burdick et al. | |
| 5,642,307 A | 6/1997 | Jernigan et al. | |
| 5,654,204 A | 8/1997 | Anderson et al. | |
| 5,726,074 A | 3/1998 | Yabe et al. | |
| 5,764,650 A | 6/1998 | Debenham | |
| 5,787,012 A | 7/1998 | Levitt et al. | |
| 5,787,190 A | 7/1998 | Peng et al. | |
| 5,801,067 A | 9/1998 | Shaw et al. | |
| 5,801,965 A | 9/1998 | Takagi et al. | |
| 5,805,472 A | 9/1998 | Fukasawa | |
| 5,822,218 A | 10/1998 | Moosa et al. | |
| 5,828,778 A | 10/1998 | Hagi et al. | |
| 5,837,558 A | 11/1998 | Zuniga et al. | |
| 5,844,803 A | 12/1998 | Beffa et al. | |
| 5,856,923 A | 1/1999 | Jones et al. | |
| 5,865,319 A | 2/1999 | Okuda et al. | |
| 5,867,505 A | 2/1999 | Beffa et al. | |
| 5,889,674 A | 3/1999 | Burdick et al. | |
| 5,890,807 A | 4/1999 | Igel et al. | |
| 5,895,962 A | 4/1999 | Zheng et al. | |
| 5,907,492 A | 5/1999 | Akram et al. | |
| 5,915,231 A | 6/1999 | Beffa et al. | |
| 5,927,512 A | 7/1999 | Beffa et al. | |
| 5,946,497 A | 8/1999 | Lee et al. | |
| 5,950,012 A | 9/1999 | Shiell et al. | |
| 5,963,881 A | 10/1999 | Kahn et al. | |
| 5,976,899 A | 11/1999 | Farnworth et al. | |
| 5,991,699 A | 11/1999 | Kulkarni et al. | |
| 5,994,915 A | 11/1999 | Farnworth et al. | |
| 6,000,830 A | 12/1999 | Asano et al. | |
| 6,018,686 A | 1/2000 | Orso et al. | |
| 6,049,624 A | 4/2000 | Wilson et al. | |
| 6,055,463 A | 4/2000 | Cheong et al. | |
| 6,067,507 A | 5/2000 | Beffa et al. | |
| 6,072,574 A | 6/2000 | Zeimantz et al. | |
| 6,075,216 A | 6/2000 | Nakamura et al. | |
| 6,100,486 A | 8/2000 | Beffa et al. | |
| 6,122,563 A | 9/2000 | Beffa et al. | |
| 6,130,442 A | 10/2000 | Di Zenzo et al. | |
| 6,138,256 A | 10/2000 | Debenham et al. | |
| 6,147,316 A | 11/2000 | Beffa et al. | |
| 6,148,307 A | 11/2000 | Burdick et al. | |
| 6,190,972 B1 | 2/2001 | Zheng et al. | |
| 6,194,738 B1 | 2/2001 | Debenham et al. | |
| 6,208,947 B1 | 3/2001 | Beffa | |
| 6,219,810 B1 | 4/2001 | Debenham | |
| 6,226,394 B1 | 5/2001 | Wilson et al. | |
| 6,259,520 B1 | 7/2001 | Zeimantz | |
| 6,265,232 B1 | 7/2001 | Simmons | |
| 6,292,009 B1 | 9/2001 | Farnworth et al. | |
| 6,307,171 B1 | 10/2001 | Beffa | |
| 6,350,959 B1 | 2/2002 | Beffa | |
| 6,363,295 B1 | 3/2002 | Akram | |
| 6,363,329 B2 | 3/2002 | Beffa | |
| 6,365,421 B2 | 4/2002 | Debenham et al. | |
| 6,365,860 B1 | 4/2002 | Beffa | |
| 6,365,861 B1 | 4/2002 | Beffa | |
| 6,373,011 B1 | 4/2002 | Beffa | |
| 6,373,566 B2 | 4/2002 | Zeimantz | |
| 6,400,840 B2 | 6/2002 | Wilson et al. | |
| 6,424,168 B1 | 7/2002 | Farnworth et al. | |
| 6,427,092 B1 | 7/2002 | Jones et al. | |
| 6,437,271 B1 | 8/2002 | Beffa | |
| 6,441,897 B1 | 8/2002 | Zeimantz | |
| 6,504,123 B2 | 1/2003 | Beffa | |
| 6,529,793 B1 | 3/2003 | Beffa | |
| 6,534,785 B1 | 3/2003 | Farnworth et al. | |
| 6,553,276 B2 | 4/2003 | Akram et al. | |
| 6,588,854 B2 | 7/2003 | Wilson et al. | |
| 6,594,611 B2 | 7/2003 | Beffa | |
| 6,613,590 B2 | 9/2003 | Simmons | |
| 6,636,068 B2 | 10/2003 | Farnworth | |
| 6,654,114 B2 | 11/2003 | Zeimantz | |
| 6,703,573 B2 | 3/2004 | Beffa | |
| 6,725,121 B1 | 4/2004 | Pasadyn et al. | |
| 6,788,993 B2 | 9/2004 | Beffa | |
| 6,895,538 B2 | 5/2005 | Benedix et al. | |
| 6,944,567 B2 | 9/2005 | Beffa | |
| 7,107,117 B2 | 9/2006 | Beffa | |
| 7,117,063 B2 | 10/2006 | Beffa | |

(56) References Cited

U.S. PATENT DOCUMENTS

| | | |
|---|---|---|
| 7,120,287 B2 | 10/2006 | Wilson et al. |
| 7,120,513 B1 | 10/2006 | Akram et al. |
| 7,124,050 B2 | 10/2006 | Beffa |
| 7,155,300 B2 | 12/2006 | Akram et al. |
| 7,169,625 B2 | 1/2007 | Davis et al. |
| RE39,518 E | 3/2007 | Toprac et al. |
| 7,276,672 B2 | 10/2007 | Beffa |
| 7,337,034 B1 | 2/2008 | Lensing et al. |
| 7,368,678 B2 | 5/2008 | Beffa |
| 7,446,277 B2 | 11/2008 | Beffa |
| 7,502,659 B2 | 3/2009 | Beffa |
| 7,517,708 B2 | 4/2009 | Deshpande et al. |
| 7,555,358 B2 | 6/2009 | Jones et al. |
| 7,561,938 B2 | 7/2009 | Akram et al. |
| 7,682,847 B2 | 3/2010 | Beffa |
| 7,738,988 B2 | 6/2010 | Jones et al. |
| 2005/0228606 A1 | 10/2005 | Beffa |
| 2007/0094632 A1 | 4/2007 | Beffa |
| 2009/0038997 A1 | 2/2009 | Beffa |
| 2010/0222913 A1* | 9/2010 | Jones et al. ............. 700/115 |

FOREIGN PATENT DOCUMENTS

| | | |
|---|---|---|
| JP | 58052814 A | 3/1983 |
| JP | 58060529 A | 4/1983 |
| JP | 61120433 A | 6/1986 |
| JP | 02164017 A | 6/1990 |
| JP | 02246312 A | 10/1990 |
| JP | 04080949 A | 3/1992 |
| JP | 04318911 A | 11/1992 |
| JP | 05013529 A | 1/1993 |
| JP | 05074909 A | 3/1993 |
| JP | 05121573 A | 5/1993 |
| JP | 05315207 A | 11/1993 |
| JP | 06013443 A | 1/1994 |
| JP | 06267809 A | 9/1994 |
| JP | 06349691 A | 12/1994 |
| JP | 07050233 A | 2/1995 |
| JP | 07066091 A | 3/1995 |
| JP | 07335510 A | 12/1995 |
| JP | 08162380 A | 6/1996 |
| JP | 10104315 A | 4/1998 |
| JP | 11008327 A | 1/1999 |
| SU | 1151333 | 4/1985 |

OTHER PUBLICATIONS

International Search Report for International Application No. PCT/US1998/05921, mailed Sep. 3, 1998, 5 pages.

* cited by examiner

METHODS FOR NON-LOT-BASED MANUFACTURING OF ARTICLES

CROSS-REFERENCE TO RELATED APPLICATIONS

This application is a continuation of U.S. patent application Ser. No. 12/776,625, filed May 10, 2010, now U.S. Pat. No. 8,315,730, issued Nov. 20, 2012, which application is a continuation of U.S. patent application Ser. No. 11/763,104, filed Jun. 14, 2007, now U.S. Pat. No. 7,738,988, issued Jun. 15, 2010, which application is a continuation of U.S. patent application Ser. No. 10/205,918, filed Jul. 25, 2002, now U.S. Pat. No. 7,555,358, issued Jun. 30, 2009, which is a continuation of U.S. patent application Ser. No. 09/137,781, filed Aug. 20, 1998, now U.S. Pat. No. 6,427,092, issued Jul. 30, 2002, which is a continuation of U.S. patent application Ser. No. 08/822,731, filed Mar. 24, 1997, now U.S. Pat. No. 5,856,923, issued Jan. 5, 1999, which is related to the following applications: Ser. No. 08/591,238, filed Jan. 17, 1996, now abandoned; Ser. No. 08/664,109, filed Jun. 13, 1996, now U.S. Pat. No. 5,895,962, issued Apr. 20, 1999; Ser. No. 08/785,353, filed Jan. 17, 1997, now U.S. Pat. No. 5,927,512, issued Jul. 27, 1999; Ser. No. 08/801,565, filed Feb. 17, 1997, now U.S. Pat. No. 5,844,803 issued Dec. 1, 1998; Ser. No. 08/806,442, filed Feb. 26, 1997, now U.S. Pat. No. 5,915,231, issued Jun. 22, 1999; and Ser. No. 08/871,015, filed Jun. 6, 1997, now U.S. Pat. No. 5,907,492, issued May 25, 1999. The disclosure of each of the previously referenced U.S. patent applications and patents is hereby incorporated by reference herein in its entirety.

BACKGROUND OF THE INVENTION

1. Field of the Invention

The present invention relates in general to integrated circuit (IC) manufacturing and, more specifically, to methods for tracking IC devices in a substantially continuous flow of IC devices from multiple lots through one or more steps in an IC manufacturing process.

2. State of the Art

Integrated circuits (ICs) are small electronic circuits formed on the surface of a wafer of semiconductor material, such as silicon, in an IC manufacturing process referred to as "fabrication." Once fabricated, ICs are probed to evaluate a variety of their electronic characteristics, cut from the wafer on which they were formed into discrete IC dice or "chips," and then assembled for customer use using various well-known IC packaging techniques, including lead frame packaging, Chip-On-Board (COB) packaging, and flip-chip packaging.

During the manufacturing process, ICs generally undergo a variety of tests to ensure they will function properly once shipped. Testing typically involves a variety of known test steps, such as speed grading, burn-in, and final, which test ICs for defects and functionality and grade ICs for speed.

ICs are typically tracked through the fabrication, probe, assembly, and test steps described above so correlations can be found between the results of tests performed on ICs in the test steps and the "path" the ICs took through the manufacturing process. For example, by tracking a group of ICs through the manufacturing process, it might be determined that ICs wire-bonded on a particular wire-bonding machine have an unusually high failure rate when tested. Similarly, it might be determined that a test machine itself is failing a disproportionate number of ICs. In either case, tracking ICs through the manufacturing process allows the source of a problem to be pinpointed and addressed.

As shown in FIG. 1, a conventional procedure 10 for tracking ICs through a process step 12 in an IC manufacturing process involves the use of lot numbers for the ICs. Lot numbers are first assigned to wafers during fabrication. Typically, a group of 20-50 wafers receives a single unique lot number (e.g., 36/1/9970). As the group of wafers proceeds to probe, the wafers are typically split into several sub-lots, with each sub-lot being assigned a new lot number (sometimes referred to as a "sub-lot" number) that is a modified form of the group's original lot number (e.g., 36/1/9970/0, 36/1/9970/1, . . . ). As the group continues through the manufacturing process, sub-lots are split and re-split for a variety of reasons until the group is typically split into many sub-lots, all having a unique lot number that is a modified form of the group's original lot number.

In the conventional tracking procedure 10, a sub-lot (e.g., sub-lot H) is received from an input queue 14 where sub-lots wait to proceed through the process step 12. The process step 12 may be any step in the IC manufacturing process including, for example, probe, wafer saw, speed grading, burn-in, or final testing.

As a sub-lot advances through the process step 12, data 16 related to the process step 12 is generated. Such data 16 may include, for example: an identification of the processing equipment and the operating personnel for the process step 12; information regarding the set-up of the process step 12; the time and date the sub-lot advanced through the process step 12; and yield and test results from the process step 12.

Once a sub-lot has advanced through the process step 12, a process report 18 is manually or automatically generated based on the generated data 16. To associate the process report 18, and hence the data 16, with the ICs in the sub-lot, and thus track the ICs through the process step 12, the process report 18 lists the lot number (e.g., "H") of the ICs in the sub-lot. Typically, the process report 18 also physically accompanies the sub-lot through the remainder of the manufacturing process to ensure that the data 16 is correlated with the ICs in the sub-lot, although this is not necessary if other indicia identifying the lot number of the ICs in the sub-lot physically accompany the sub-lot through the manufacturing process.

With the process report 18 generated, a processed sub-lot (e.g., sub-lot H) is cleared from equipment associated with the process step 12 to an output queue 20 to prepare the process step 12 for processing another sub-lot (e.g., sub-lot I). Once the processed sub-lot is cleared, the next sub-lot can be processed. This "clearing" process is necessary because if two sub-lots (e.g., sub-lots H and I) proceed through the process step 12 in a continuous manner, the conventional tracking procedure 10 is unable to correlate the data 16 and the process report 18 generated as each of the two sub-lots proceed with the correct sub-lot. Instead, the data 16 for the two sub-lots is mixed, causing the conventional tracking procedure 10 to fail to uniquely track the two sub-lots through the process step 12.

The conventional tracking procedure described above is problematic because it makes inefficient use of often very expensive manufacturing and test equipment and other resources by leaving sub-lots "parked" in input queues while process reports are generated and the equipment is cleared of already processed sub-lots. In process steps that use multiple machines in parallel to process a sub-lot, some machines may be idle while other machines finish their allotment from the sub-lot being processed and the next sub-lot waits in an input queue. In addition, generation of the process reports, as well as clearing a processed sub-lot from equipment, often requires laborious manual work by operating personnel. Further, a process report that must physically accompany a sub-lot through the manufacturing process may become lost or damaged, and thus is not as reliable a means of tracking ICs as is desired.

As described in U.S. Pat. Nos. 5,301,143, 5,294,812, and 5,103,166, some methods have been devised to aid quality control personnel in tracking ICs undergoing failure analysis back to the wafer from which they come. By tracking the ICs back to their wafer, test data related to the ICs can be correlated to the wafer to pinpoint possible problems with the wafer. Such methods take place "off" the manufacturing line and involve the use of electrically retrievable identification (ID) codes, such as so-called "fuse IDs," programmed into individual ICs to identify the ICs. Fuse IDs and other electrically retrievable ID codes are typically programmed into ICs by blowing selected fuses or anti-fuses in circuitry on the ICs so that the circuitry outputs the ID code when accessed. Unfortunately, none of these methods addresses the inefficiency problems caused by the conventional lot-based tracking procedure described above.

Therefore, there is a need in the art for a procedure for tracking ICs through an IC manufacturing process that uses manufacturing resources more efficiently. Such a procedure should not leave equipment idle while ICs wait to be processed. In addition, such a procedure should achieve a level of reliability not reached by conventional tracking procedures.

BRIEF SUMMARY OF THE INVENTION

An inventive method for tracking IC devices of the type to each have a substantially unique ID code (e.g., a fuse ID) through a step in an IC manufacturing process includes: reading the ID code of each of the IC devices; advancing multiple lots of the IC devices through the step in the manufacturing process in a substantially continuous manner; generating data, such as processing equipment data or test data, related to the advancement of each of the IC devices through the step in the process; and associating the data generated for each of the IC devices with the ID code of its associated IC device.

By associating the data with the ID codes, the inventive method allows the IC devices to be tracked through the step in the process. Further, because multiple lots of the IC devices can advance through the step in the manufacturing process continuously, manufacturing resources are used more efficiently. In addition, because the ID codes and associated data read and generated using the inventive method need not physically accompany ICs as they progress through the manufacturing process, the inventive method is more reliable than conventional tracking procedures.

In another embodiment, a method of manufacturing IC devices from semiconductor wafers includes: providing wafers in multiple lots; fabricating ICs on the wafers; causing each of the ICs to permanently store a substantially unique ID code, such as a fuse ID; separating the ICs from their wafers to form IC dice; assembling the IC dice into IC devices; reading the ID code from the IC in each of the IC devices; testing each of the IC devices; while testing the IC devices: advancing the IC devices from the multiple lots of wafers through at least one test step in a substantially continuous manner; generating data related to the advancement of each of the IC devices through the test step; and associating the data generated for each of the IC devices with the ID code of the IC in its associated IC device.

In a further embodiment, a method for correlating variables related to an IC manufacturing process with variables related to the performance of IC devices as they advance through the process includes: causing each of multiple ICs from multiple lots to permanently store a substantially unique ID code, such as a fuse ID; reading the ID code from each of the IC devices; advancing the IC devices from the multiple lots through at least one step in the manufacturing process in a substantially continuous manner; while the IC devices advance through the step in the manufacturing process, generating data related to process variables associated with the step in the process; generating data related to variables associated with the performance of at least some of the IC devices as they advance through at least one step in the manufacturing process; and associating the process variable-related data and the performance variable-related data generated for each of the IC devices with the ID code of the IC device associated with the data to correlate the process variables with the performance variables.

DETAILED DESCRIPTION OF THE INVENTION

Figure 1:
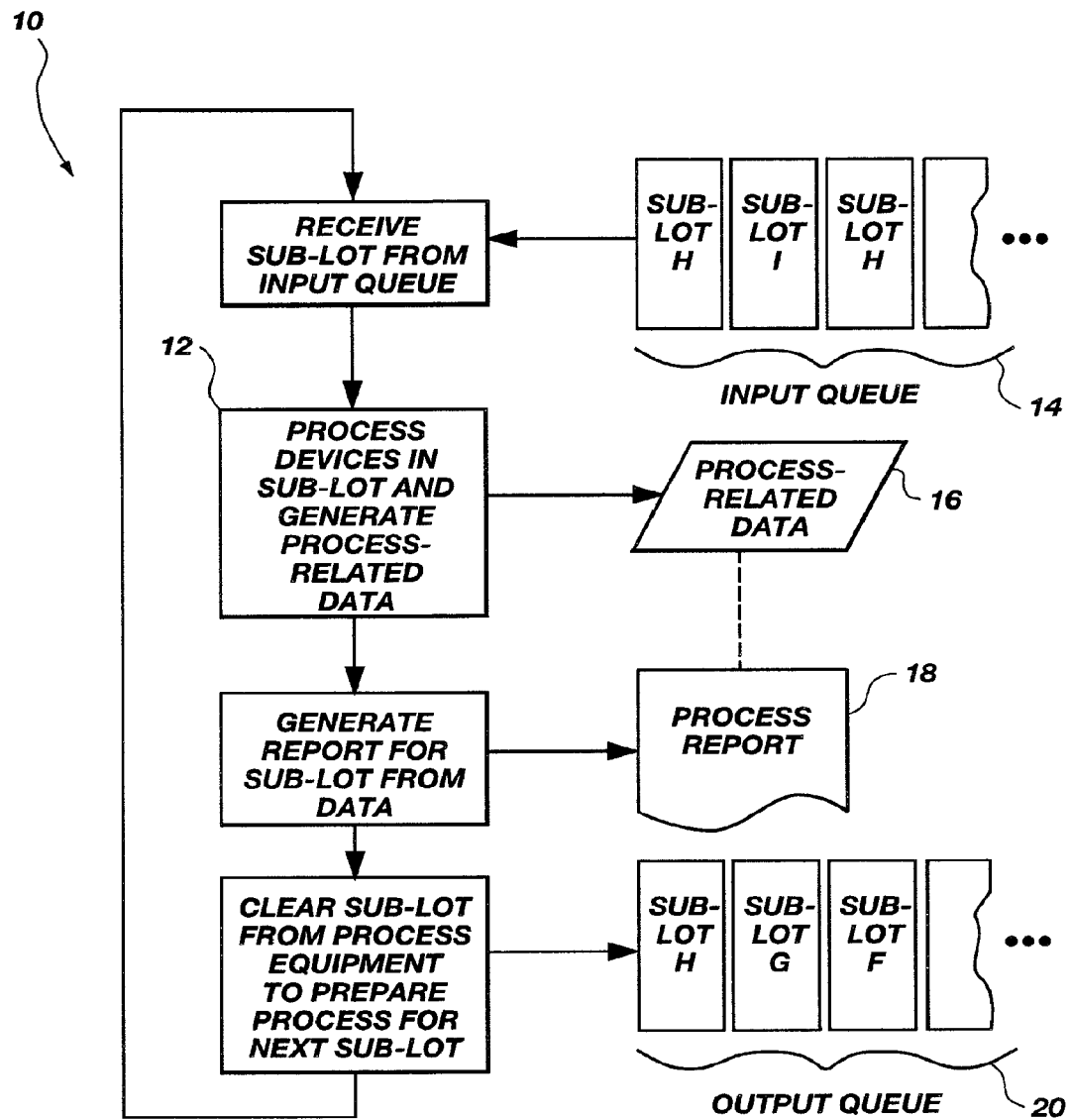
FIG. 1 is a flow diagram showing a process step in a conventional lot-based IC manufacturing process.
Figure 2:
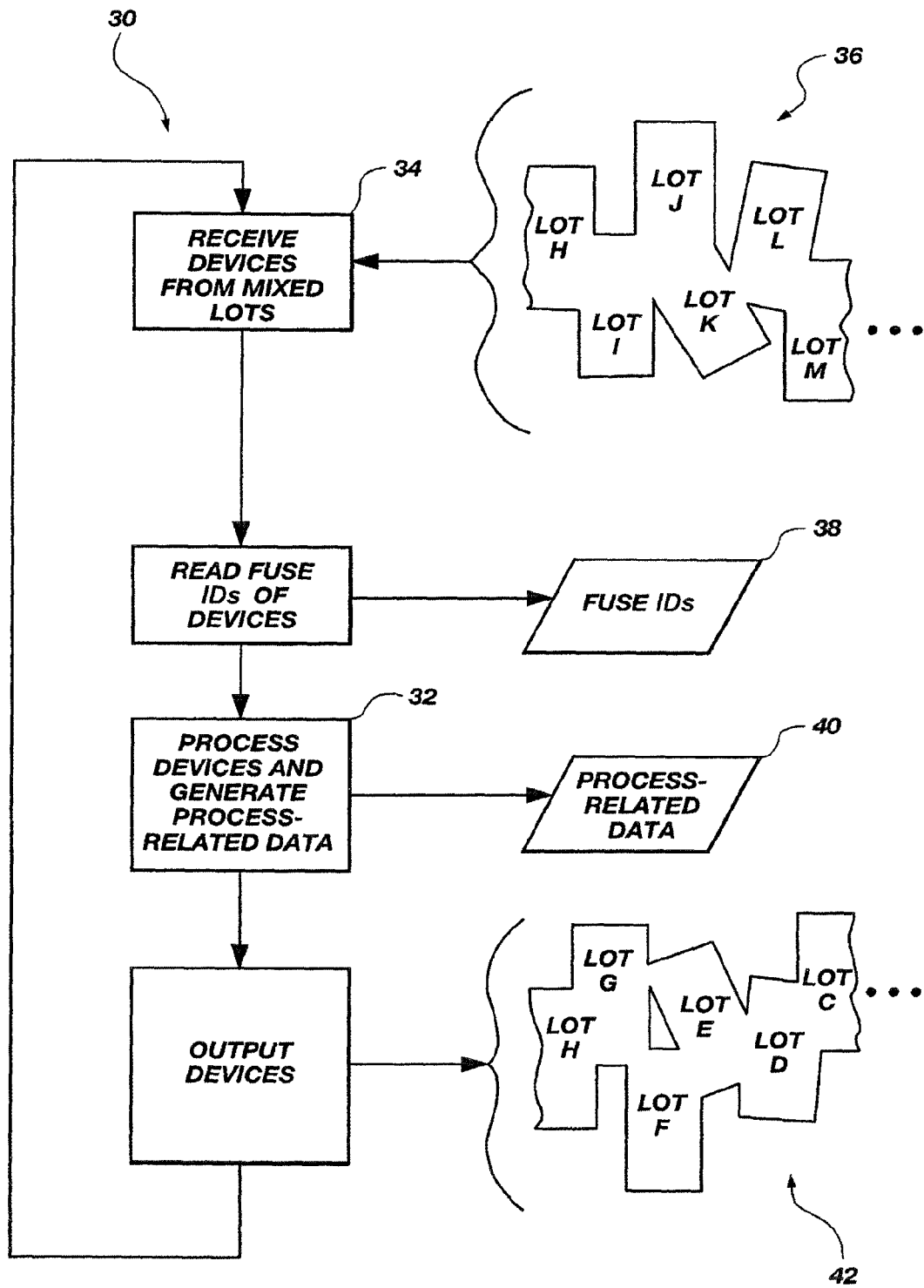
FIG. 2 is a flow diagram showing a process step in a substantially continuous, non lot-based IC manufacturing process in accordance with the present invention.

As shown in FIG. 2, an inventive method 30 for tracking IC devices through a step 32 in an IC manufacturing process includes a step 34 of receiving IC devices from multiple, mixed input lots 36. It will be understood by those having skill in the field of this invention that the invention is applicable to any IC devices, including Dynamic Random Access Memories (DRAMs), Static Random Access Memories (SRAMs), Synchronous DRAMs (SDRAMs), processors, Application Specific ICs (ASICs), Read Only Memory (ROM) ICs, Electrically Erasable Programmable ROM (EEPROM) ICs, and to mixtures of different types of IC devices. Further, it will be understood that the process step 32 may be any step in an IC manufacturing process, including assembly and test steps. It will also be understood that the process step 32 may encompass processing by a single machine, part of a machine, many machines operating in series or parallel, or any combination thereof. In addition, it will be understood that the step 34 of receiving IC devices from multiple, mixed input lots 36 is without regard to the lots from which the IC devices come, and thus allows a more efficient use of processing equipment than traditional lot-based procedures. It will also be understood, of course, that although the present invention is described as being implemented in a single process step 32 for ease of understanding, the invention more typically is implemented on a series of process steps, such as all back-end test steps.

The IC devices are each programmed with a unique ID code, such as the well-known fuse ID described above. Briefly, a fuse ID is programmed in an IC device by selectively blowing fuses or anti-fuses in a circuit on the IC device so that when the circuit is accessed, it outputs an ID code. Although it is preferable that the ID code programmed into each IC device be unique by specifying, for example, a lot number, wafer number, and wafer position for the IC device, it is not necessary to implement the present invention. For example, if the ID code is the same for all IC devices derived from the same semiconductor wafer, or from the same lot, it will work for purposes of the present invention.

Before or after the IC devices progress through the process step 32, their ID codes are read and stored in a computer as data 38. As the IC devices progress through the process step 32, data 40 related to the process step 32 is generated for each IC device. Such data 40 may include, for example, process variables such as the processing equipment used, the operating personnel present, the set-up, and the time and date of processing for the process step 32, and performance variables such as yield and test results from the process step 32. The set-up for the process step 32 may include, for example, a standard set-up or a set-up in accordance with a Special Work Request (SWR) by engineering personnel.

The ID code data 38 and process-related data 40 may be automatically correlated by computer with data from process steps prior to the process step 32 through reference to the ID codes common to the ID code data 38 generated in the process step 32 and ID code data generated in the prior process steps. As a result, correlations can be found between process variables, such as the processing equipment used, and performance variables, such as test results. Thus, for example, it might be discerned that the IC devices derived from a particular section of the semiconductor wafers provided by a particular supplier have an unusually high failure rate at a particular test step. The process of correlation is preferably performed in real time so information is available immediately, although it is within the scope of the present invention to perform the correlation at a later time.

Once the IC devices have advanced through the process step 32, the processed IC devices are output from the process step 32 to mixed output lots 42. It should be understood that, in some cases, the processed IC devices must be cleared from processing equipment before other IC devices can be processed, and in other cases, such as in serial-feed machines, processed IC devices are being output from the process step 32 while other IC devices are advancing through the process step 32 and still other IC devices are being received by the process step 32. Any of these cases fall within the scope of the present invention.

It should be understood that by reading the ID codes of processed IC devices and associating those codes with data generated during processing, the inventive method 30 avoids the need for lot-based manufacturing altogether. The mixed input lots 36 and output lots 42 may then be mixed without regard to lots, and the processing of IC devices through the process step 32 may proceed in a substantially continuous fashion, thus dramatically improving the utilization of processing equipment. In addition, because the ID codes and associated data read and generated using the inventive method need not physically accompany ICs as they progress through the manufacturing process, the inventive method is more reliable than conventional tracking procedures.

Although the present invention has been described with reference to a particular embodiment, the invention is not limited to this described embodiment. For example, the present invention includes within its scope the manufacture of Single In-line Memory Modules (SIMMs) and Dual In-line Memory Modules (DIMMs), as well as the IC devices described above. Thus, the invention is limited only by the appended claims, which include within their scope all equivalent methods that operate according to the principles of the invention as described.

What is claimed is:

1. A method of tracking an article of manufacture in a manufacturing process, the method comprising:

associating an article of manufacture with a substantially unique identification (ID) code, wherein the substantially unique ID code is retrievable from the article of manufacture;

advancing the article of manufacture through at least a portion of the manufacturing process with one or more other articles of manufacture without regard to a lot from which any of the articles of manufacture comes;

generating data related to the advancement of the article of manufacture through the at least a portion of the manufacturing process;

associating the data with the substantially unique ID code; and outputting the article of manufacture to a mixed output lot comprising articles of manufacture from one or more lots different from the lot with which the article of manufacture was associated before advancing through the at least a portion of the manufacturing process.

2. The method of claim 1, wherein the substantially unique ID code comprises a machine readable ID code.

3. The method of claim 1, wherein associating an article of manufacture with a substantially unique ID code comprises programming the article of manufacture with the substantially unique ID code.

4. The method of claim 1, wherein the at least a portion of the manufacturing process comprises an act in the manufacturing process.

5. The method of claim 1, wherein the article of manufacture comprises an electronic device.

6. The method of claim 5, wherein the substantially unique ID code specifies, at least in part, a lot number.

7. The method of claim 5, wherein the substantially unique ID code is the same for all electronic devices comprising at least one component from a common source.

8. The method of claim 5, wherein the substantially unique ID code is the same for all electronic devices coming from the same lot.

9. The method of claim 1, further comprising reading the substantially unique ID code before advancing the article of manufacture through the at least a portion of the manufacturing process.

10. The method of claim 1, further comprising reading the substantially unique ID code after advancing the article of manufacture through the at least a portion of the manufacturing process.

11. The method of claim 1, further comprising storing the substantially unique ID code before advancing the article of manufacture through the at least a portion of the manufacturing process.

12. The method of claim 1, further comprising storing the substantially unique ID code after advancing the article of manufacture through the at least a portion of the manufacturing process.

13. The method of claim 1, wherein the data comprises process-related data.

14. The method of claim 1, wherein the data comprises a process variable.

15. The method of claim 14, wherein the data comprises a performance variable.

16. The method of claim 15, further comprising determining whether a correlation exists between the process variable and the performance variable.

17. The method of claim 1, wherein the data comprises a performance variable.

18. A method of tracking an article of manufacture in a manufacturing process, the method comprising:

associating an article of manufacture with a substantially unique identification (ID) code, wherein the substantially unique ID code is retrievable from the article of manufacture;

mixing the article of manufacture with other articles of manufacture without regard to lots;

advancing the article of manufacture with the other articles of manufacture through at least a portion of the manufacturing process without regard to a lot from which the article of manufacture comes;

generating data related to the advancement of the article of manufacture through the at least a portion of the manufacturing process;

associating the data with the substantially unique ID code; and outputting the article of manufacture to a mixed output lot comprising articles of manufacture from one or more lots different from the lot with which the article of manufacture was associated before advancing through the at least a portion of the manufacturing process.

19. A method of tracking an article of manufacture in a manufacturing process, the method comprising:

receiving the article of manufacture from a plurality of mixed lots of articles of manufacture without regard to a lot of the plurality of mixed lots of articles of manufacture from which the article of manufacture comes;

associating the article of manufacture with a substantially unique identification (ID) code, wherein the substantially unique ID code is retrievable from the article of manufacture;

advancing the article of manufacture through at least a portion of the manufacturing process without regard to the lot of the plurality of mixed lots of articles of manufacture from which the article of manufacture comes;

generating data related to the advancement of the article of manufacture through the at least a portion of the manufacturing process;

associating the data with the substantially unique ID code; and outputting the article of manufacture to a mixed output lot comprising articles of manufacture from one or more lots different from the lot with which the article of manufacture was associated before advancing through the at least a portion of the manufacturing process.

* * * * *